United States Patent
Noh et al.

(10) Patent No.: US 10,983,024 B2
(45) Date of Patent: Apr. 20, 2021

(54) SEMICONDUCTOR PRESSURE SENSOR

(71) Applicant: DAEYANG ELECTRIC CO., LTD., Busan (KR)

(72) Inventors: Sang Soo Noh, Incheon (KR); Eung Ahn Lee, Incheon (KR); Sung Ho Yoo, Incheon (KR); Jeong Ju Kim, Incheon (KR); Kyoung Hun Kim, Incheon (KR)

(73) Assignee: DAEYANG ELECTRIC CO., LTD., Busan (KR)

( * ) Notice: Subject to any disclaimer, the term of this patent is extended or adjusted under 35 U.S.C. 154(b) by 265 days.

(21) Appl. No.: 16/325,561

(22) PCT Filed: May 17, 2018

(86) PCT No.: PCT/KR2018/005655
§ 371 (c)(1),
(2) Date: Feb. 14, 2019

(87) PCT Pub. No.: WO2019/107680
PCT Pub. Date: Jun. 6, 2019

(65) Prior Publication Data
US 2021/0063262 A1   Mar. 4, 2021

(30) Foreign Application Priority Data

Nov. 28, 2017 (KR) .................. 10-2017-0160569
Mar. 19, 2018 (KR) .................. 10-2018-0031303
May 14, 2018 (KR) .................. 10-2018-0054913

(51) Int. Cl.
*G01L 9/00* (2006.01)
*G01L 9/04* (2006.01)
*G01L 1/18* (2006.01)

(52) U.S. Cl.
CPC .............. *G01L 9/0051* (2013.01); *G01L 9/04* (2013.01)

(58) Field of Classification Search
CPC ..... G01L 1/00; G01L 1/18; G01L 1/22; G01L 9/00–08; G01L 9/0051
See application file for complete search history.

(56) References Cited

U.S. PATENT DOCUMENTS 8,250,934 B2 *  8/2012  Sakurai ................. G01P 15/123
                                                   73/862.044
8,616,065 B2 * 12/2013  Stewart ................... G01L 9/065
                                                       73/721
9,429,491 B2 *  8/2016  Bemis ..................... G01L 9/065
9,714,876 B2 *  7/2017  Huo ....................... G01L 9/0054

FOREIGN PATENT DOCUMENTS

KR    10-2016-0115830 A    10/2016

* cited by examiner

*Primary Examiner* — Nguyen Q. Ha
(74) *Attorney, Agent, or Firm* — Novick, Kim & Lee, PLLC; Jae Youn Kim (57) ABSTRACT

Provided is a semiconductor pressure sensor which includes: five connection pads having plate shapes and formed of conductive materials, respectively, and arranged in parallel with each other; and four semiconductor resistance units connecting a predetermined pair of the connection pads to each other among the connection pads and having resistance values varying in proportion to a variation of a length due to the external pressure, wherein the five connection pads include a power supply pad, a first output voltage pad, a first ground pad, a second output voltage pad, and a second ground pad.

20 Claims, 7 Drawing Sheets

SEMICONDUCTOR PRESSURE SENSOR

TECHNICAL FIELD

The present invention relates to a semiconductor pressure sensor, and more specifically, to a semiconductor pressure sensor having one or two full Wheatstone bridge structures, the semiconductor pressure sensor including: five connection pads formed of a conductive material; and four semiconductor resistors connected to the connection pads and having resistance values varying in proportion to variations of lengths according to an external pressure.

BACKGROUND ART

In general, a pressure sensor is used in the technical field of sensors widely used in vehicles, environmental facilities, medical devices, and the like, and is used in devices that require pressure measurement in environments where vibrations or sudden pressure changes occur frequently. A measurement principle of the pressure sensor is to use a fact that a shape of a semiconductor is changed in proportion to a pressure applied to the semiconductor so as to vary a resistance value of the semiconductor. The pressure sensor includes a Wheatstone bridge to which a voltage is applied, so that, when an external pressure is applied to the Wheatstone bridge, the resistance value of the semiconductor generated due to physical bending is measured to detect a degree of pressure.

A conventional semiconductor pressure sensor is a sensing element exposed to an environment where the pressure is applied, and includes an electronic package having at least one highly doped semiconductor strain gage.

DISCLOSURE

Technical Problem

An object of the present invention is to provide a semiconductor pressure sensor having a single power supply unit and capable of forming a full Wheatstone bridge.

In addition, an object of the present invention is to provide a semiconductor pressure sensor in which connection pads forming the Wheatstone bridge are overlapped with each other to reduce a total area of the semiconductor pressure sensor, so that a production yield is improved, and an area of a wire bonding part of the connection pad is enlarged.

In addition, an object of the present invention is to provide a semiconductor pressure sensor in which two independent full Wheatstone bridges are constituted with four resistors, and a pressure variation is measured by the two independent full Wheatstone bridges, so that two pressure measurement values are compared with each other.

Technical Solution

According to one embodiment of the present invention, a semiconductor pressure sensor provided on a measurement target object to measure an external pressure applied to the measurement target object includes: five connection pads having plate shapes and formed of conductive materials, respectively, and arranged in parallel with each other; and four semiconductor resistance units connecting a predetermined pair of the connection pads to each other among the connection pads and having resistance values varying in proportion to a variation of a length due to the external pressure, wherein the five connection pads include a power supply pad, a first output voltage pad, a first ground pad, a second output voltage pad, and a second ground pad, the power supply pad is disposed in a middle, the first output voltage pad and the first ground pad are disposed on one side of the power supply pad, and the second output voltage pad and the second ground pad are disposed on an opposite side of the power supply pad, and the first output voltage pad connects the first ground pad to the power supply pad, and the second output voltage pad connects the second ground pad to the power supply pad.

In addition, the five connection pads may constitute a single full Wheatstone bridge.

In addition, each of the semiconductor resistance units may include: an upper resistance unit connected to one connection pad while extending in a longitudinal direction and a lower resistance unit extending from another connection pad in the longitudinal direction to connect the one connection pad to the another connection pad to be connected to the one connection pad; and a resistance adjustment unit provided between the upper resistance unit and the lower resistance unit to adjust a resistance between the connection pads.

In addition, the five connection pads may be arranged in parallel with each other while being spaced apart from each other at equal intervals, and the upper resistance unit and the lower resistance unit may be spaced apart from each other at equal intervals when viewed in a direction in which the five connection pads are arranged.

According to one embodiment of the present invention, a semiconductor pressure sensor provided on a measurement target object to measure an external pressure applied to the measurement target object includes: a first connection pad, a second connection pad, a third connection pad, a fourth connection pad, and a fifth connection pad having plate shapes and formed of conductive materials, respectively; and four semiconductor resistance units connecting a predetermined pair of the connection pads to each other among the connection pads and having resistance values varying in proportion to a variation of a length due to the external pressure, wherein the third connection pad is disposed in a middle, the first connection pad and the second connection pad are disposed on one side of the third connection pad, and the fourth connection pad and the fifth connection pad are disposed on an opposite side of the third connection pad, and two or more connection pads electrically connected to each other among the five connection pads have portions overlapped with each other when viewed in a first direction which is a longitudinal direction of the third connection pad.

In addition, both ends of each of the first to fifth connection pads may be disposed within a range of both ends of the third connection pad when viewed in the first direction.

In addition, the third connection pad may be arranged in parallel with other connection pads and may have no overlapping portion, and the first connection pad, the second connection pad, the fourth connection pad, and the fifth connection pad may have portions overlapped with each other, when viewed in the first direction.

In addition, the third connection pad may include two sub-connection pads configured to extend in the first direction, and the sub-connection pads may be configured to be connected to each other while being offset from each other in a second direction perpendicular to the first direction, and may have portions overlapped with another connection pad, respectively, when viewed in the first direction.

In addition, the five connection pads may constitute a single full Wheatstone bridge.

In addition, the five connection pads may include a single power supply pad, a first output voltage pad, a first ground pad, a second output voltage pad, and a second ground pad, the power supply pad may be disposed in the middle, the first output voltage pad and the first ground pad may be disposed on one side of the power supply pad, and the second output voltage pad and the second ground pad may be disposed on an opposite side of the power supply pad.

In addition, the five connection pads may include a single ground pad, a first power supply pad, a first output voltage pad, a second power supply pad, and a second output voltage pad, the ground pad may be disposed a center, the first power supply pad and the first output voltage pad may be disposed on one side of the ground pad, and the second power supply pad and the second output voltage pad may be disposed on an opposite side of the ground pad.

In addition, the five connection pads may constitute two full Wheatstone bridges.

In addition, the four semiconductor resistance units may be connected to an external applied voltage through external fixed resistors, respectively, to constitute two independent full Wheatstone bridges.

In addition, each of the semiconductor resistance units may include: an upper resistance unit connected to one connection pad while extending in a longitudinal direction and a lower resistance unit extending from another connection pad in the longitudinal direction to connect the one connection pad to the another connection pad to be connected to the one connection pad; and a resistance adjustment unit provided between the upper resistance unit and the lower resistance unit to equally adjust a resistance between the connection pads.

In addition, the upper resistance unit and the lower resistance unit may be spaced apart from each other at equal intervals when viewed in a direction in which the five connection pads are arranged.

According to one embodiment of the present invention, a semiconductor pressure sensor provided on a measurement target object to measure an external pressure applied to the measurement target object includes: a first connection pad, a second connection pad, a third connection pad, a fourth connection pad, and a fifth connection pad having plate shapes and formed of conductive materials, respectively; and four semiconductor resistance units connecting a predetermined pair of the connection pads to each other among the connection pads and having resistance values varying in proportion to a variation of a length due to the external pressure, wherein the third connection pad is a common ground pad or a common power supply pad, and the first connection pad, the second connection pad, and the third connection pad constitute a first full Wheatstone bridge, and the fourth connection pad, the fifth connection pad, and the third connection pad constitute a second full Wheatstone bridge.

In addition, the third connection pad may be disposed in a middle, the first connection pad and the second connection pad may be disposed on one side of the third connection pad, and the fourth connection pad and the fifth connection pad may be disposed on an opposite side of the third connection pad.

In addition, the four semiconductor resistance units may have an asymmetrical shape with respect to each other about the third connection pad.

In addition, the first connection pad may serve as an output of the first semiconductor resistance unit, and the second connection pad may serve as an output of the second semiconductor resistance unit to constitute a first full Wheatstone bridge, and the fourth connection pad may serve as an output of the third semiconductor resistance unit, and the fifth connection pad may serve as an output of the fourth semiconductor resistance unit to constitute a second full Wheatstone bridge.

In addition, the third connection pad may be a common ground pad, and the four semiconductor resistance units may be connected to an external applied voltage through external fixed resistors, respectively, to constitute two independent full Wheatstone bridges.

Advantageous Effects

According to one embodiment of the present invention, the semiconductor pressure sensor has a single power supply unit, so that it is easy to maintain an identical applied voltage in comparison with a semiconductor pressure sensor in which a plurality of power supply units are connected to connection pads, and thus a single external power supply connection unit can be provided. Accordingly, an entire manufacturing process of the semiconductor pressure sensor can be simplified, and a manufacturing cost can be reduced. In addition, a configuration of a circuit of the semiconductor pressure sensor is simplified, so that an excellent effect of simplifying installation of the pressure sensor and reducing a risk of failure can be obtained.

In addition, in the semiconductor pressure sensor according to one embodiment of the present invention, the connection pads forming the Wheatstone bridge have portions overlapped with each other so as to reduce the total area of the semiconductor pressure sensor, so that the production yield can be improved. In addition, the area of the wire bonding part of the connection pad is enlarged so as to enable double bonding and wire bonding of various widths, so that wire connection can be stable.

In addition, in the semiconductor pressure sensor according to one embodiment of the present invention, a length of the semiconductor resistance unit is adjusted to control a size of a resistor, so that power consumption can be reduced, and the semiconductor pressure sensor can be connected to various kinds of integrated circuits with different allowable powers.

In addition, in the semiconductor pressure sensor according to one embodiment of the present invention, two independent full Wheatstone bridges are constituted with four resistors, and the pressure variation is measured by the two independent full Wheatstone bridges so as to compare two pressure measurement values with each other, so that accuracy of pressure measurement can be increased. In addition, the two independent full Wheatstone bridges are used, so that the pressure can be measured by an extra full Wheatstone bridge that operates normally even in the event of failure in some components.

MODE FOR INVENTION

Best Mode

Hereinafter, the embodiments of the present invention will be described in detail with reference to accompanying drawings, so that those having ordinary skill in the art to which the invention pertains may easily implement the present invention. However, the present invention is not limited to the embodiments set forth herein, and may be embodied in many different forms. In addition, in the drawings, the portions irrelevant to the description will not be shown in order to make the present invention clear.

Terms used herein are intended to describe certain embodiments only, and shall by no means limit the present invention. Unless the context clearly indicates otherwise, expressions in a singular form include a meaning of a plural form.

In the present specification, the term such as "comprising", "including" or "having" is intended to designate the presence of characteristics, numbers, steps, operations, elements, parts or combinations thereof, and shall not be construed to preclude any possibility of presence or addition of one or more other characteristics, numbers, steps, operations, elements, parts or combinations thereof.

In addition, the following embodiments will be provided to explain more clearly to those skilled in the art, and the shapes and sizes of the elements in the drawings may be exaggerated for clarity of explanation.

Hereinafter, preferred embodiments of the present invention will be described with reference to the accompanying drawings.

Figure 1:
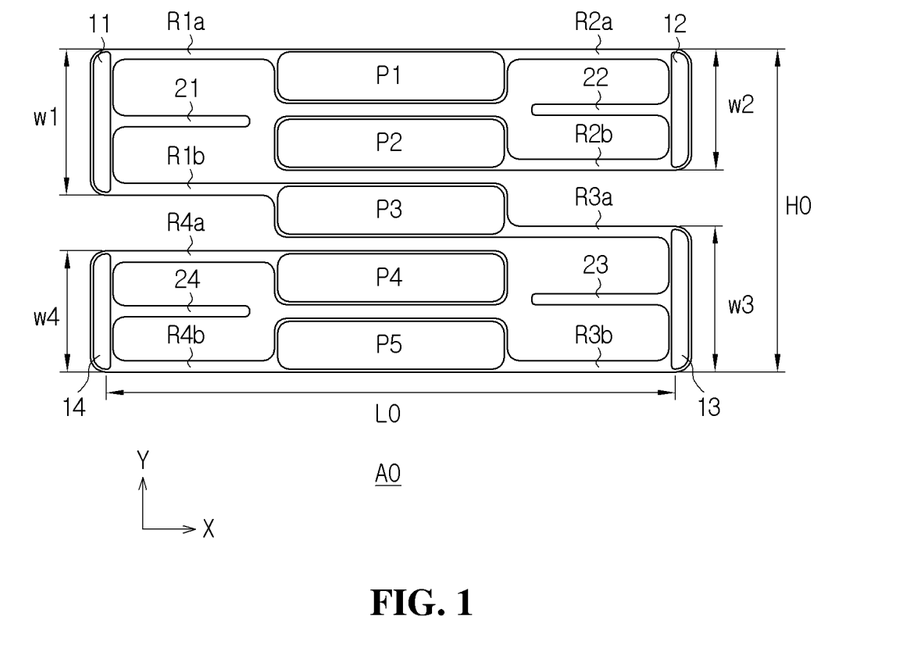
FIG. 1 is a structural view showing a semiconductor pressure sensor having a single power supply unit according to one embodiment of the present invention.
Figure 2:
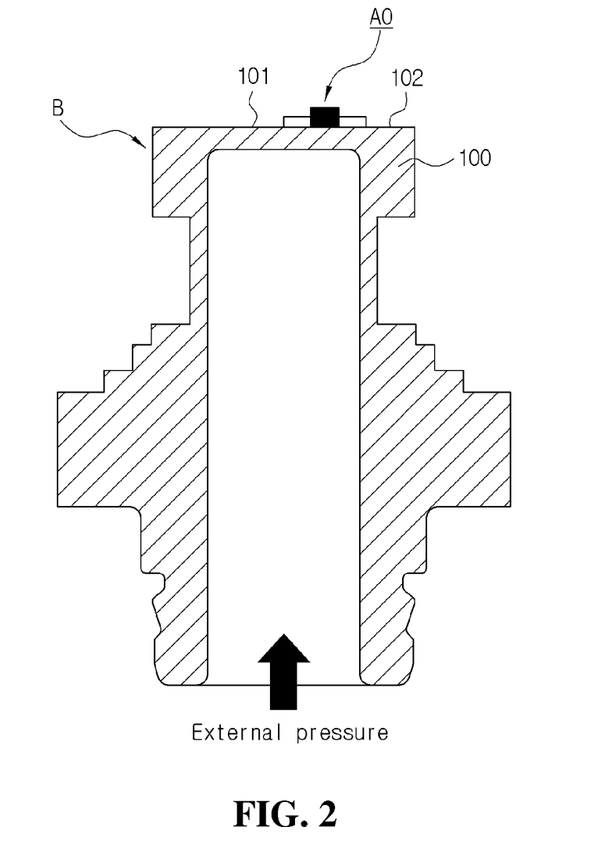
FIG. 2 is a partial sectional view showing a pressure measurement device to which the semiconductor pressure sensor of FIG. 1 is applied.
Figure 3:
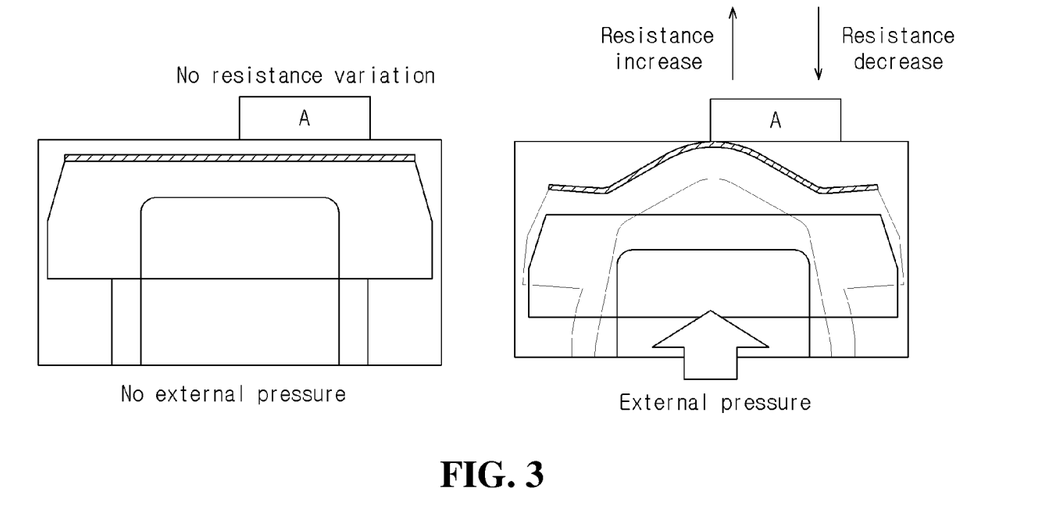
FIG. 3 is a view for explaining an operation principle of the pressure measurement device when an external pressure is applied in FIG. 2.

FIG. 1 is a structural view showing a semiconductor pressure sensor having a single power supply unit according to one embodiment of the present invention, and FIG. 2 is a partial sectional view showing a pressure measurement device to which the semiconductor pressure sensor of FIG. 1 is applied. FIG. 3 is a view for showing an operation principle of the pressure measurement device when an external pressure is applied.

Referring to FIGS. 1 to 3, a semiconductor pressure sensor A0 according to one embodiment of the present invention is provided on a pressure deformation surface 100 of a measurement target object to measure an external pressure applied to the measurement target object. The semiconductor pressure sensor A0 may include five connection pads P (P1 to P5) and four semiconductor resistance units R (R1 to R4).

In the present specification, the connection pad P may collectively refer to a first connection pad P1, a second connection pad P2, a third connection pad P3, a fourth connection pad P4, and a fifth connection pad P5. In addition, the semiconductor resistance unit R may collectively refer to upper resistance units R1a, R2a, R3a, and R4a, lower resistance units R1b, R2b, R3b, and R4b, and connection units 11, 12, 13, and 14 for connecting the upper resistance units R1a, R2a, R3a, and R4a to the lower resistance units R1b, R2b, R3b, and R4b.

The five connection pads P may be formed of a conductive material, may be arranged in parallel with each other, and may have a rectangular shape with a thin thickness. Each of the four semiconductor resistance units R may connect a predetermined pair of the connection pads P to each other, and a resistance value may vary in proportion to a variation of a length according to the external pressure.

The five connection pads P1 to P5 may correspond to a single common power supply pad P3, a first output voltage pad P1, a first ground pad P2, a second ground pad P4, and a second output voltage pad P5. The power supply pad P3, which is a third connection pad, may be disposed in a middle of the connection pads P, the first output voltage pad P1 and the first ground pad P2 may be disposed on one side of the power supply pad P1, and the second output voltage pad P5 and the second ground pad P4 may be disposed on an opposite side of the power supply pad P3. In addition, the first output voltage pad P1 connects the first ground pad P2 to the power supply pad P3, and the second output voltage pad P5 connects the second ground pad P4 to the power supply pad P3. The five connection pads having the above structure may constitute a single full Wheatstone bridge circuit with a single power supply.

The four semiconductor resistance units R include the upper resistance units R1a, R2a, R3a, and R4a, and the lower resistance units R1b, R2b, R3b, and R4b. The connection units 11, 12, 13, and 14 for connecting the upper resistance units R1a, R2a, R3a, and R4a to the lower resistance units R1b, R2b, R3b, and R4b are formed in a vertical direction (Y-axis direction in the drawing). The connection units 11, 12, 13, and 14 may be coated with a metal material identical to a material plated on the connection pad to minimize an influence of a resistance depending on lengths and areas of the connection units 11, 12, 13, and 14. Examples of the metal material may include gold plating, aluminum plating, silver plating, etc.

Meanwhile, in order to make an overall shape of a product stable regardless of an electrical flow in an entire circuit of the semiconductor pressure sensor A0 having the single power supply unit, structure reinforcing units 21, 22, 23 and 24 may be formed at centers of the connection units 11, 12, 13, and 14 in a direction perpendicular to the connection unit (that is, parallel to the upper and lower resistance units), respectively.

In the present embodiment, the connection pads P may have an identical shape, which is a thin rectangular plate shape, elongated in a horizontal direction (X-axis direction in the drawing), the semiconductor resistance units R may have an identical shape elongated in the horizontal direction, and the structure reinforcing units 21, 22, 23, and 24 may have an identical shape elongated in the horizontal direction. However, heights w1, w2, w3, and w4 of the connection units 11, 12, 13, and 14 may be two different heights depending on positions. In the present embodiment, the connection units 11 and 13 may be provided at positions symmetrical to each other and may have an identical height, and the connection units 12 and 14 may be provided at positions symmetrical to each other and may have an identical height. The connection units 11, 12, 13, and 14 may be formed of a conductive material.

The connection pads P may have a thin elongated rectangular plate shape having a width longer than the height, and the connection pads P may be spaced apart from each other at intervals relatively smaller than a height w of the connection pad P.

The shape of the semiconductor pressure sensor A0 will be described in more detail. A first upper resistance unit R1a is connected to a left upper end of the first connection pad P1. The first upper resistance unit R1a has a thin rectangular shape with a height of about one-third of the height of the first connection pad P1 and a width of a length similar to a width of the first connection pad P1, and is connected in parallel with the first connection pad P1. The first connection unit 11 electrically connecting the first upper resistance unit R1a to the first lower resistance unit R1b has a thin elongated rectangular shape with a rounded corner, and connects a left end of the first upper resistance unit R1a to a left end of the first lower resistance unit R1b. In addition, in order to make the overall shape of the product stable regardless of the electrical flow in the entire circuit of the semiconductor pressure sensor A0 and to facilitate a manufacturing process, a first assembly 21 may extend rightward from a central portion of the first connection unit 11 in an up-down direction (Y-axis direction). For example, the first assembly 21 may be a first assembly 21 having a length of about five-sixths of a length of the semiconductor resistance unit R, but the length and a width of the first assembly 21 may vary. Other connection pads P2, P3, P4, and P5, other semiconductor resistance units R2, R3, and R4, and other connection units 12, 13 and 14 may be configured in a similar scheme.

The operation principle of the semiconductor pressure sensor A0 having the single power supply unit according to one embodiment of the present invention will be described with reference to FIG. 2. A pressure measurement device B to which the semiconductor pressure sensor A0 is attached may have a shape of a cylinder formed therein with a hollow, in which upper and lateral side portions are closed, and only a lower portion is opened such that an inside thereof may communicate with an outside thereof. When the external pressure is transmitted through an arbitrary medium such as a fluid to the hollow of the cylinder of the pressure measurement device B, the pressure is applied in a direction from the lower portion toward the upper portion. An upper pressure deformation surface 100 of the pressure measurement device B is produced such that a physical deformation occurs in proportion to a size of the pressure. When the external pressure increases, a portion near a central axis of the cylinder of the pressure measurement device B becomes convex upward with respect to the central axis, so that an upper central surface 101 is enlarged more than before. Meanwhile, in a part of an upper surface away from the central axis of the cylinder of the pressure measurement device B, when the external pressure is increased, an expansion length at an upper side of an upper plate is smaller than an expansion length at a lower side of the upper plate, so that an outer peripheral surface 102 becomes smaller than before.

As shown in FIG. 3, the semiconductor pressure sensor A0 may be installed on the upper pressure deformation surface 100 of the pressure measurement device B in the horizontal direction such that right and left ends of the first connection pad P1 of the semiconductor pressure sensor A0 are positioned in a middle of the central surface 101 and the outer peripheral surface 102. In this case, when the external pressure increases due to a fluid transmitted into the cylinder, a length of the central surface 101 is increased, so that the length of the semiconductor resistance unit R disposed on the central surface 101 is increased at an identical rate, and thus a resistance value is increased. Meanwhile, when the external pressure increases, a length of the outer peripheral surface 102 is decreased, so that the length of the semiconductor resistance unit R disposed on the outer peripheral surface 102 is decreased at an identical rate, and thus the resistance value is decreased. Therefore, a degree of a resistance value variation of the semiconductor resistance unit R is measured, so that the pressure applied from the outside to the inside of the pressure measurement device B may be measured.

There are two schemes for installing the semiconductor pressure sensor A0 on the upper pressure deformation surface 100 of the pressure measurement device B according to an installation direction thereof. A first installation scheme C1 is a case in which the first connection unit 11 and the fourth connection unit 14 are disposed on the central surface 101, and the second connection unit 12 and the third connection unit 13 are disposed on the outer peripheral surface 102. A second installation scheme C2 is a case in which the second connection unit 12 and the third connection unit 13 are disposed on the central surface 101, and the first connection unit 11 and the fourth connection unit 14 are disposed on the outer peripheral surface 102. Depending on the installation schemes, a total of two types of full Wheatstone bridges may be created.

Regarding the semiconductor pressure sensor A0 according to one embodiment of the present invention, in constituting a full Wheatstone bridge for measuring a variation of a resistance value of the semiconductor resistance unit R according to a pressure variation, the first connection pad P1 serves as a first output voltage unit, the second connection pad P2 serves as a first ground unit, the third connection pad P3 serves as a common power supply unit, the fourth connection pad P4 serves as a second ground unit, and the fifth connection pad P5 serves as a second output voltage unit. Therefore, even when an external power supply connection unit is provided as a single unit, the semiconductor pressure sensor A0 may be operable, and it is easy to maintain an identical applied voltage. In addition, since the single external power supply connection unit is provided, an entire manufacturing process of the semiconductor pressure sensor A0 is simplified while a manufacturing cost is reduced, and a configuration of a circuit to be connected is simplified so that an excellent effect of simplifying installation of the pressure sensor and reducing a risk of failure may be obtained.

Figure 4:
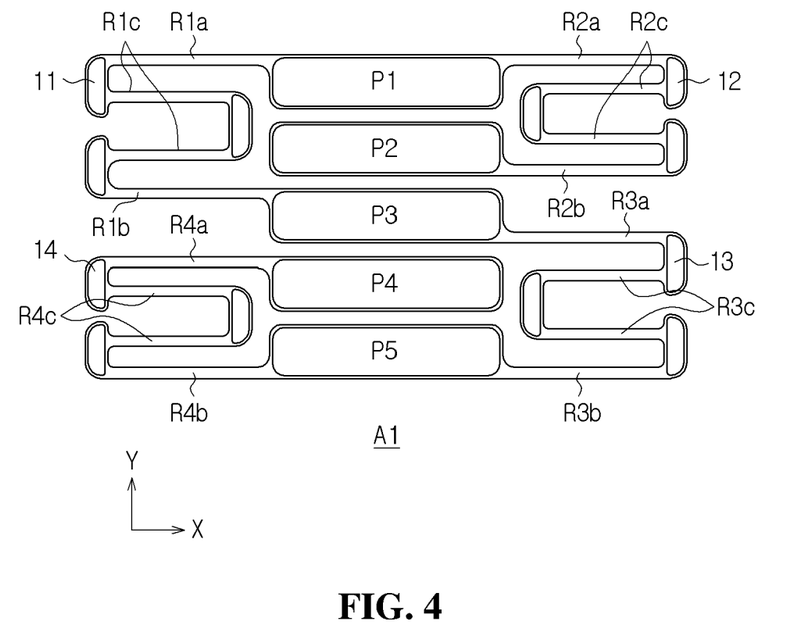
FIG. 4 is a structural view showing a semiconductor pressure sensor having a resistance adjustment unit according to one embodiment of the present invention.

FIG. 4 is a structural view showing a semiconductor pressure sensor having a resistance adjustment unit according to one embodiment of the present invention.

First, referring to FIG. 4, when a semiconductor pressure sensor A1 according to one embodiment of the present invention is compared with the semiconductor pressure sensor P0 shown in FIG. 1, there is a difference in that resistance adjustment units R1c, R2c, R3c, and R4c configured to be curved toward the connection pad P are provided between the connection units 11, 12, 13, and 14 for connecting the upper resistance units R1a, R2a, R3a, and R4a to the lower resistance units R1b, R2b, R3b, and R4b. The semiconductor pressure sensor A1 is electrically connected to a separate IC chip to transmit measured resistance values to the IC chip. The IC chip may have different allowable resistances depending on purposes and functions thereof, and IC chips with small power consumption are preferably used. According to the present embodiment, since the semiconductor pressure sensor A1 includes the resistance adjustment units R1c, R2c, R3c, and R4c, an overall resistance length may be adjusted while a total resistance value may be increased upon an operation of the semiconductor pressure sensor A1, so that power consumption may be reduced.

FIGS. 5 to 8 are structural views showing semiconductor pressure sensors having an overlap structure according to one embodiment of the present invention.

Figure 5:
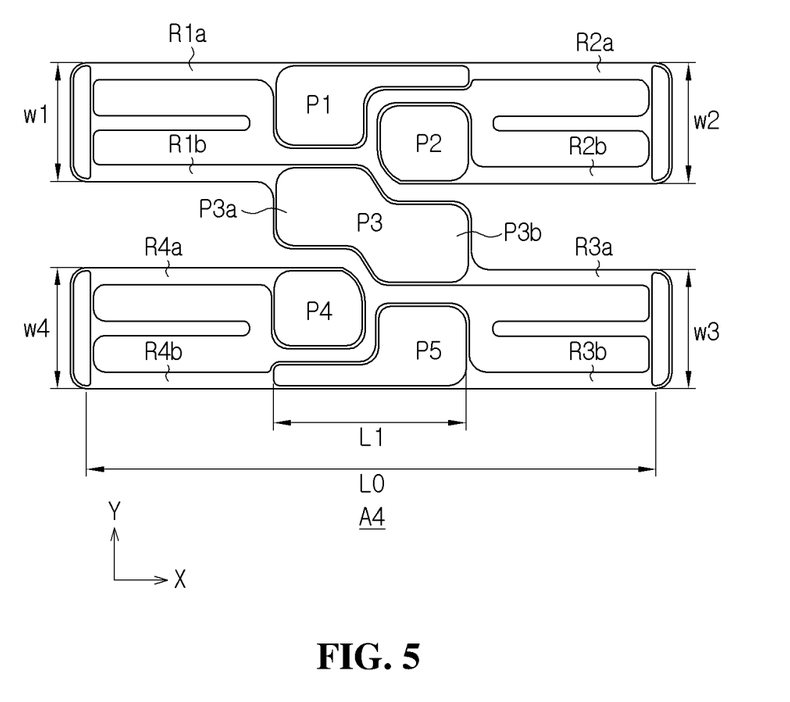
FIGS. 5 to 8 are structural views showing semiconductor pressure sensors having an overlap structure according to one embodiment of the present invention.

First, referring to FIG. 5, when a semiconductor pressure sensor A4 having an overlap structure according to one embodiment of the present invention is compared with the semiconductor pressure sensor A0 shown in FIG. 1, the five connection pads P1, P2, P3, P4, and P5 have different shapes.

In detail, the semiconductor pressure sensor A4 includes a first connection pad P1, a second connection pad P2, a third connection pad P3, a fourth connection pad P4, and a fifth connection pad P5, which have plate shapes and are formed of conductive materials while being spaced apart from each other. In addition, the semiconductor pressure sensor A4 includes four semiconductor resistance units R1, R2, R3, and R4 connecting a predetermined pair of the connection pads P to each other among the five connection pads P and having resistance values varying in proportion to a variation of a length due to the external pressure. The third connection pad P3 may be disposed in a middle, the first connection pad P1 and the second connection pad P2 may be disposed on one side of the third connection pad P3, and the fourth connection pad P4 and the fifth connection pad P5 may be disposed on an opposite side of the third connection pad P3. Widths of the connection pads P may be different from each other, and heights of the connection pads P may be equal to each other.

In the semiconductor pressure sensor A4 according to FIG. 5, two or more connection pads electrically connected to each other among the five connection pads P have portions overlapped with each other when viewed in a first direction (X-axis direction) which is a longitudinal direction of the third connection pad (P3). In this case, the overlap means that a part of the connection pad disposed at a rear side may not be seen due to the connection pad disposed at a front side when viewed in a specific direction. In the present embodiment, a size of the overlap may be between 10% and 60% of the height of each of the connection pads. In this case, the first connection pad P1 and the second connection pad P2 may have portions overlapped with each other when viewed in the first direction (X-axis direction). In addition, the second connection pad P2 may be overlapped with the first connection pad P1 and the third connection pad P3 at a same time. The fourth connection pad P4 may be overlapped with the third connection pad P3 and the fifth connection pad P5. Meanwhile, both ends of each of the first connection pad P1, the second connection pad P2, the fourth connection pad P4, and the fifth connection pad P5 may be disposed within a range of both ends of the third connection pad P3.

When the semiconductor pressure sensor A4 according to the present embodiment is compared with the semiconductor pressure sensor A0 shown in FIG. 1, an area of the connection pad P may be increased without changing the height and a width of the semiconductor pressure sensor A4. In other words, the height of the connection pad P may be increased while an overall size of the semiconductor pressure sensor A4 is maintained to be equal to an overall size of the semiconductor pressure sensor A0 shown in FIG. 1. Accordingly, the connection pad P may be bonded to a thick wire, a wire bonding angle may vary, and wires bonded to the connection pads P may be prevented from interfering with each other because of a large interval between the wires. In addition, since the height of the connection pad P is increased, a plurality of times of wire bonding may be performed on a single connection pad P, so that electrical connection may be stabilized.

Meanwhile, the heights w1, w2, w3, and w4 of the connection units of the semiconductor resistance unit R of the semiconductor pressure sensor A4 may be set to be identical to each other. As shown in the drawing, since the connection pad P1 and the connection pad P2 have portions overlapped with each other, the first lower resistance unit R1$b$ and the second lower resistance unit R2$b$ may be disposed at an identical height in the vertical direction (Y-axis direction). Accordingly, total lengths of the first semiconductor resistance unit R1 and the second semiconductor resistance unit R2 are maintained to be equal to each other, so that actual resistance values may be set to be equal to each other. Similarly, total lengths of the third semiconductor resistance unit R3 and the fourth semiconductor resistance unit R4 are maintained to be equal to each other, so that actual resistance values may be set to be equal to each other. In the present embodiment, the heights w1, w2, w3, and w4 of the connection units of the semiconductor resistance unit R are set to be identical to each other, so that the length and the actual resistance value of the semiconductor resistance unit R may be equal to each other. Therefore, a manufacturing process for the semiconductor pressure sensor A1 may be uniform. In addition, an offset between resistors is minimized, so that a voltage difference (offset) between two outputs of the Wheatstone bridge may be minimized.

Meanwhile, as in the embodiment shown in FIG. 5, the third connection pad P3 disposed in the middle may be configured to have a shape in which a central portion is offset, other than a rectangular shape. The third connection pad P3 may be configured such that two sub-connection pads P3$a$ and P3$b$ are connected to each other while being offset from each other in a Y-axis direction. The sub-connection pads P3$a$ and P3$b$ may be configured to extend in the first direction (X-axis direction), and may be connected to each other while being offset from each other in a direction (Y-axis direction) perpendicular to the first direction. Accordingly, when viewed in the first direction, the sub-connection pad P3$a$ has a portion overlapped with the second connection pad P2, and the sub-connection pad P3$b$ has a portion overlapped with the fourth connection pad P4.

Meanwhile, although not shown, when the height of each of the connection pads P of the semiconductor pressure sensor A4 shown in FIG. 5 is maintained to be equal to the height of the connection pad P of the semiconductor pressure sensor A0 shown in FIG. 1, a total height of the semiconductor pressure sensor A4 may be reduced so that the size of the semiconductor pressure sensor A4 may be reduced. Therefore, when a height of a bonding part is maintained to be equal to a height of a bonding part of the semiconductor pressure sensor A0 shown in FIG. 1, the overall size of the semiconductor pressure sensor A4 is reduced, so that productivity may be improved.

Figure 6:
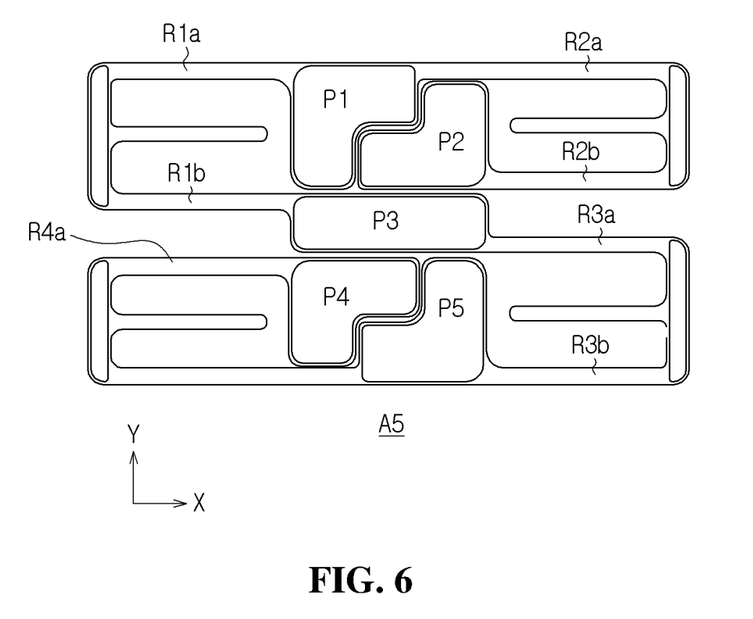
Figure 7:
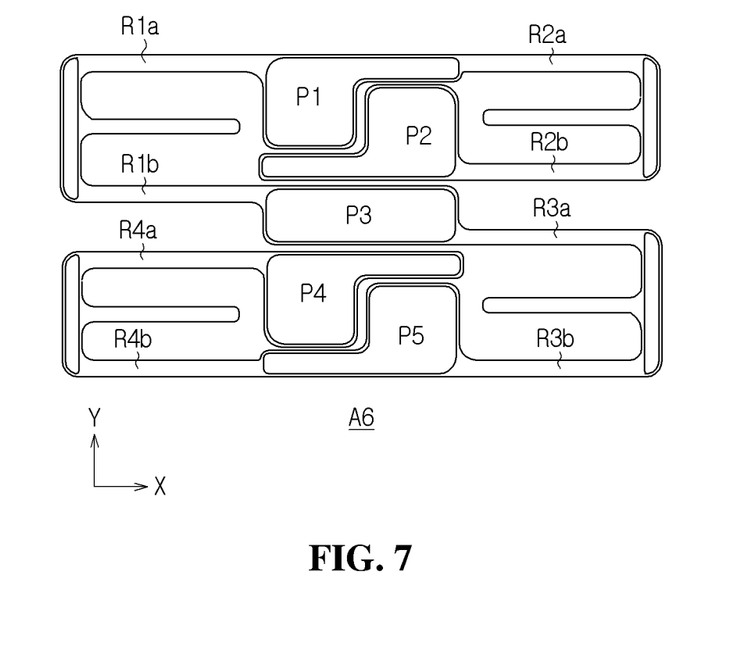
Figure 8:
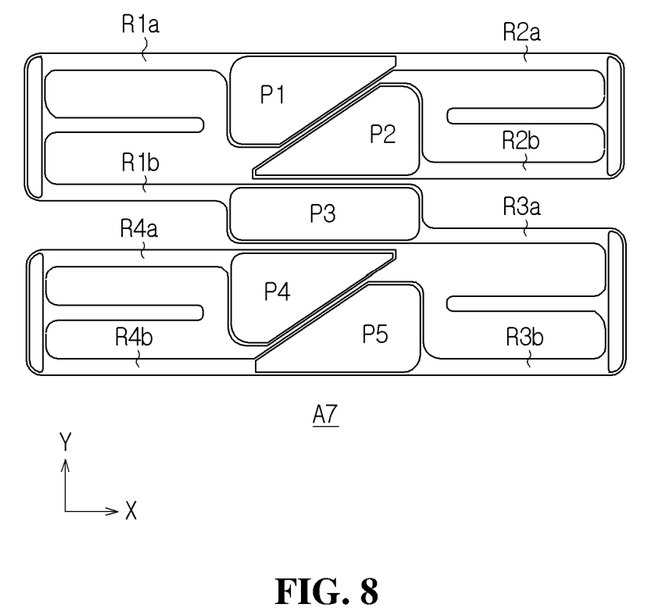

Referring to FIGS. 6 to 8, semiconductor pressure sensors A5, A6, and A7 having overlap structures different from the above embodiment are shown. In the present embodiments, the connection pad P3 disposed in the middle has no offset and is arranged in parallel with other connection pads P1, P2, P4, and P5, the first connection pad P1 and the second connection pad P2 are overlapped with each other when viewed in the first direction (X-axis direction), and the fourth connection pad P4 and the fifth connection pad P5 are overlapped with each other. Particularly, since the semiconductor pressure sensors A5 and A6 shown in FIGS. 6 and 7 are configured such that the connection pads P1, P2, P4, and P5 have block shapes which are symmetrical to each other, heights of the connection pads P1, P2, P4, and P5 are increased, so that various wire bonding effects may be obtained, and overall sizes of the semiconductor pressure sensors A5 and A6 may be reduced. Meanwhile, as shown in FIG. 8, the connection pads P1, P2, P4, and P5 of the semiconductor pressure sensor A7 may be provided with diagonal inclination parts on surfaces facing each other. An overlapping degree may be adjusted by relatively moving the connection pads P1 and P2 and the connection pads P4 and P5, which face each other, in a diagonal direction. Accordingly, an overall size of the semiconductor pressure sensor A7 and a total resistance of the semiconductor resistance unit R may be appropriately adjusted. Therefore, within a predetermined area of a semiconductor wafer, a production schedule of the semiconductor pressure sensor A7 may be established in consideration of a production yield of the semiconductor pressure sensor A7 and a target resistance value of the semiconductor resistance unit R.

The five connection pads P1, P2, P3, P4, and P5 of the above semiconductor pressure sensors A4, A5, A6, and A7 shown in FIGS. 5 to 8 may include a single power supply pad, a first output voltage pad, a first ground pad, a second output voltage pad, and a second ground pad. In this case, the power supply pad may be the third connection pad P3 disposed in the middle, and the first output voltage pad and the first ground pad may be the first connection pad P1 and the second connection pad P2 disposed on one side of the third connection pad P3, respectively. In addition, the second output voltage pad and the second ground pad may be the fifth connection pad P5 and the fourth connection pad P4 disposed on an opposite side of the third connection pad P3, respectively.

Alternatively, the five connection pads P1, P2, P3, P4, and P5 of the above semiconductor pressure sensors A4, A5, A6, and A7 shown in FIGS. 5 to 8 may include a single ground pad, a first power supply pad, a first output voltage pad, a second power supply pad, and a second output voltage pad. In this case, the ground pad may be the third connection pad P3 disposed in the middle, and the first power supply pad and the first output voltage pad may be the second connection pad P2 and the first connection pad P1 disposed on one side of the third connection pad P3, respectively. In addition, the second power supply pad and the second output voltage pad may be the fourth connection pad P4 and the fifth connection pad P5 disposed on an opposite side of the third connection pad P3, respectively. The semiconductor pressure sensors A5, A6, A7, and A8 according to the above embodiments may constitute a single full Wheatstone bridge.

Figure 9A:
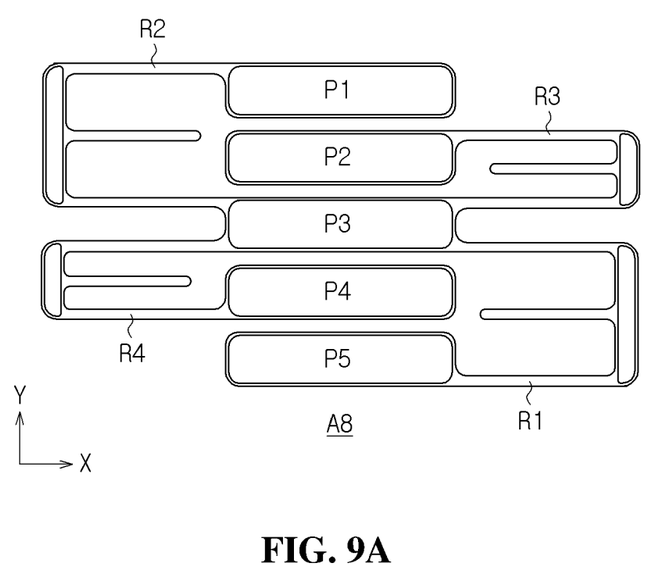
FIGS. 9A and 9B are structural views showing a semiconductor pressure sensor constituting two full Wheatstone bridges according to one embodiment of the present invention.
Figure 9B:
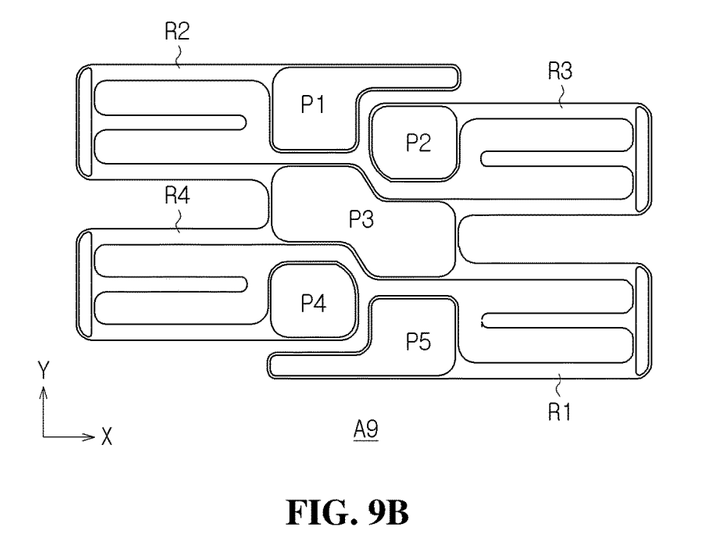
Figure 10:
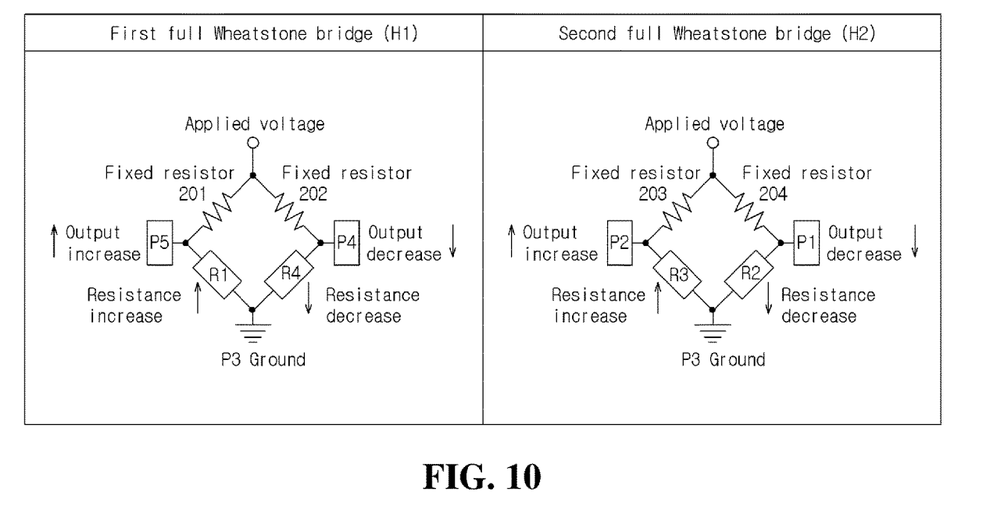
FIG. 10 is a view for explaining an operation of two full Wheatstone bridge circuits constituted with four resistors by using the semiconductor pressure sensor shown in FIG. 9.

FIG. 9 is a structural view showing a semiconductor pressure sensor constituting two full Wheatstone bridges according to one embodiment of the present invention, and FIG. 10 is a view for explaining an operation of two full Wheatstone bridge circuits constituted with four resistors by using the semiconductor pressure sensor shown in FIG. 9.

Referring to FIGS. 9a and 9b, when the semiconductor pressure sensors A8 and A9 according to the present embodiment are compared with the semiconductor pressure sensors according to the above embodiments, there is a difference in terms of connection between the semiconductor resistance unit R and the connection pad P. The five connection pads P of the semiconductor pressure sensors A8 and A9 constitute two full Wheatstone bridges. As shown in FIG. 10, each of the four semiconductor resistance units R may be connected to an external applied voltage through separate external fixed resistors, respectively, to constitute two independent full Wheatstone bridges.

Referring to FIG. 9a, the semiconductor pressure sensor A8 shown in the drawing may constitute two independent full Wheatstone bridges with the four semiconductor resistance units R. The semiconductor pressure sensor A8 is configured such that the first connection pad P1, which is a conductor, has an thin elongated rectangular shape, and the second connection pad P1 having a shape similar to a shape of the first connection pad P2 is provided at a lower end of the first connection pad P1 while being spaced apart from the first connection pad P2 at an interval shorter than the height of the first connection pad P1. In addition, similar to the above scheme, the third connection pad P3, the fourth connection pad P4, and the fifth connection pad P5, which are conductors, may be sequentially arranged in a downward direction while being spaced apart from each other at equal intervals. The connection pads P may be provided in parallel with each other in the horizontal direction.

Meanwhile, the first semiconductor resistance unit R1 connects a lower right end of the fifth connection pad P5 to a lower right end of the third connection pad P3, the second semiconductor resistance unit R2 connects an upper left end of the first connection pad P1 to an upper left end of the third connection pad P3, the third semiconductor resistance unit R3 connects an upper right end of the third connection pad P3 to an upper right end of the second connection pad, and the fourth semiconductor resistance unit R4 connects a lower left end of the third connection pad P3 to a lower left end of the fourth connection pad P4. Similar to the semiconductor resistance unit R shown in FIG. 1, each of the semiconductor resistance units R may include an upper resistance unit, a lower resistance unit, and a connection unit for connecting the upper resistance unit to the lower resistance unit. In addition, a structure reinforcing unit may be provided at a center of the connection unit.

Meanwhile, when the semiconductor pressure sensor A9 shown in FIG. 9b is compared with the semiconductor pressure sensor A8 shown in FIG. 9a, there is a difference in that the connection pads 8 have a structure with an overlap as in the semiconductor pressure sensor A4 shown in FIG. 5.

Referring to FIG. 10, a circuit configuration and an operation principle of the semiconductor pressure sensors A8 and A9 according to the present embodiment will be described as follows. Four external fixed resistors 201, 202, 203, and 204 and one or two applied voltages may be provided in an external circuit connected to the semiconductor pressure sensors A8 and A9 to constitute a total of two independent full Wheatstone bridges H1 and H2. The first semiconductor resistance unit R1 and the third semiconductor resistance unit R3 of the semiconductor pressure sensors A8 and A9 may be disposed on a side where a resistance increases when a pressure is applied to the pressure deformation surface 100 of the pressure measurement device B shown in FIG. 2, and the second semiconductor resistance unit R2 and the fourth semiconductor resistance unit R4 may be disposed on a side where the resistance decreases. Accordingly, the first semiconductor resistance unit R1, the fourth semiconductor resistance unit R4, and the external fixed resistors 201 and 202 may constitute the first full Wheatstone bridge H1. In this case, the fifth connection pad P5 serves as an output of the first semiconductor resistance unit R1, the fourth connection pad P4 serves as an output of the fourth semiconductor resistance unit R4, and the third connection pad P3 serves as a ground unit. In addition, the one or two applied voltages and the two fixed resistors 201 and 202 connected to the fourth connection pad P4 and the fifth connection pad P5 are provided in a separate external circuit. When an external force is applied to the pressure deformation surface 100, a resistance value of the first semiconductor resistance unit R1 is increased so that an output voltage of the fifth connection pad P5 is increased, and a resistance value of the fourth semiconductor resistance unit R4 is decreased so that an output voltage of the fourth connection pad P4 is decreased.

Meanwhile, the third semiconductor resistance unit R3, the second semiconductor resistance unit R2, and the external fixed resistors 203 and 204 may constitute the second full Whetstone bridge H2. In this case, the second connection pad P2 serves as an output of the third semiconductor resistance unit R3, the first connection pad P1 serves as an output of the second semiconductor resistance unit R2, and the third connection pad P3 serves as a common ground unit. In addition, the one or two applied voltages and the two fixed resistors 203 and 204 connected to the first connection pad P1 and the second connection pad P2 are provided in a separate external circuit. When an external force is applied to the pressure deformation surface 100, a resistance value of the third semiconductor resistance unit R3 is increased so that an output voltage of the second connection pad P2 is increased, and a resistance value of the second semiconductor resistance unit R2 is decreased so that an output voltage of the first connection pad P1 is decreased.

In the semiconductor pressure sensors A8 and A9 according to the present embodiment, the two independent full Wheatstone bridges H1 and H2 are constituted to measure a pressure variation, so that two pressure measurement values are compared with each other, and thus accuracy of pressure measurement may be increased. In addition, since the two independent full Wheatstone bridges H1 and H2 are used, even if some components of one full Wheatstone bridge H1 fail, the pressure may be measured by another full Wheatstone bridge H2 that operates normally as a redundancy. In addition, although not shown, the semiconductor resistance units R constituting the two independent full Wheatstone bridges may be configured with different patterns to have asymmetrical lengths and resistance values, so that two different pressure measurement values may be obtained, and thus reliability of the pressure measurement may be increased.

The above description of the present invention has been given for illustrative purposes, and it will be understood by those of ordinary skill in the art to which the invention pertains that various changes in form and details may be easily made without changing the technical idea or essential features of the present invention. Therefore, the embodiments described above should be construed in a descriptive sense only in all aspects and not for purposes of limitation. The scope of the present invention is defined not by the detailed description but by the appended claims, and should be construed as encompassing the meaning and scope of the claims and all changes or modifications derived from the equivalent concept thereof.

INDUSTRIAL APPLICABILITY

The semiconductor pressure sensor according to the present invention has the industrial applicability because it is possible to repeatedly manufacture the same product in the manufacturing industry of a general semiconductor pressure sensor.

The invention claimed is:

1. A semiconductor pressure sensor provided on a measurement target object to measure an external pressure applied to the measurement target object, the semiconductor pressure sensor comprising:
    five connection pads having plate shapes and formed of conductive materials, respectively, and arranged in parallel with each other; and
    four semiconductor resistance units connecting a predetermined pair of connection pads to each other among the five connection pads and having resistance values varying in proportion to a variation of a length due to the external pressure,
    wherein the five connection pads include a power supply pad, a first output voltage pad, a first ground pad, a second output voltage pad, and a second ground pad,
    the power supply pad is disposed in a middle, the first output voltage pad and the first ground pad are disposed on one side of the power supply pad, and the second output voltage pad and the second ground pad are disposed on an opposite side of the power supply pad, and
    the first output voltage pad connects the first ground pad to the power supply pad, and the second output voltage pad connects the second ground pad to the power supply pad.

2. The semiconductor pressure sensor of claim 1, wherein the five connection pads constitute a single full Wheatstone bridge.

3. The semiconductor pressure sensor of claim 1, wherein each of the semiconductor resistance units includes:
    an upper resistance unit connected to one connection pad while extending in a longitudinal direction and a lower resistance unit extending from another connection pad in the longitudinal direction to connect the one connection pad to the another connection pad; and
    a resistance adjustment unit provided between the upper resistance unit and the lower resistance unit to adjust a resistance among the five connection pads.

4. The semiconductor pressure sensor of claim 3, wherein the five connection pads are arranged in parallel with each other while being spaced apart from each other at equal intervals, and
    the upper resistance unit and the lower resistance unit are spaced apart from each other at equal intervals when viewed in a direction in which the five connection pads are arranged.

5. A semiconductor pressure sensor provided on a measurement target object to measure an external pressure applied to the measurement target object, the semiconductor pressure sensor comprising:
    a first connection pad, a second connection pad, a third connection pad, a fourth connection pad, and a fifth connection pad having plate shapes and formed of conductive materials, respectively; and
    four semiconductor resistance units connecting a predetermined pair of connection pads to each other among the first to fifth connection pads and having resistance values varying in proportion to a variation of a length due to the external pressure,
    wherein the third connection pad is disposed in a middle, the first connection pad and the second connection pad are disposed on one side of the third connection pad, and the fourth connection pad and the fifth connection pad are disposed on an opposite side of the third connection pad, and
    two or more connection pads electrically connected to each other among the five connection pads have portions overlapped with each other when viewed in a first direction which is a longitudinal direction of the third connection pad.

6. The semiconductor pressure sensor of claim 5, wherein both ends of each of the first to fifth connection pads are disposed within a range of both ends of the third connection pad when viewed in the first direction.

7. The semiconductor pressure sensor of claim 5, wherein the third connection pad is arranged in parallel with other connection pads and has no overlapping portion, and the first connection pad, the second connection pad, the fourth connection pad, and the fifth connection pad have portions overlapped with each other, when viewed in the first direction.

8. The semiconductor pressure sensor of claim 5, wherein the third connection pad includes two sub-connection pads configured to extend in the first direction, and
the sub-connection pads are configured to be connected to each other while being offset from each other in a second direction perpendicular to the first direction, and have portions overlapped with another connection pad, respectively, when viewed in the first direction.

9. The semiconductor pressure sensor of claim 5, wherein the first to fifth connection pads constitute a single full Wheatstone bridge.

10. The semiconductor pressure sensor of claim 9, wherein the first connection pad is a single power supply pad, the second connection pad is a first output voltage pad, the third connection pad is a first ground pad, the fourth connection pad is a second output voltage pad, and the fifth connection pad is a second ground pad, the single power supply pad is disposed in the middle, the first output voltage pad and the first ground pad are disposed on one side of the power supply pad, and the second output voltage pad and the second ground pad are disposed on an opposite side of the power supply pad.

11. The semiconductor pressure sensor of claim 5, wherein the first connection pad is a single ground pad, the second connection pad is a first power supply pad, the third connection pad is a first output voltage pad, the fourth connection pad is a second power supply pad, and the fifth connection pad is a second output voltage pad, the ground pad is disposed a center, the first power supply pad and the first output voltage pad are disposed on one side of the ground pad, and the second power supply pad and the second output voltage pad are disposed on an opposite side of the ground pad.

12. The semiconductor pressure sensor of claim 5, wherein the first to fifth connection pads constitute two full Wheatstone bridges.

13. The semiconductor pressure sensor of claim 12, wherein the four semiconductor resistance units are connected to an external applied voltage through external fixed resistors, respectively, to constitute two independent full Wheatstone bridges.

14. The semiconductor pressure sensor of claim 5, wherein each of the semiconductor resistance units includes:
an upper resistance unit connected to one connection pad while extending in a longitudinal direction and a lower resistance unit extending from another connection pad in the longitudinal direction to connect the one connection pad to the another connection; and
a resistance adjustment unit provided between the upper resistance unit and the lower resistance unit to equally adjust a resistance among the first to fifth connection pads.

15. The semiconductor pressure sensor of claim 14, wherein the upper resistance unit and the lower resistance unit are spaced apart from each other at equal intervals when viewed in a direction in which the first to fifth connection pads are arranged.

16. A semiconductor pressure sensor provided on a measurement target object to measure an external pressure applied to the measurement target object, the semiconductor pressure sensor comprising:
a first connection pad, a second connection pad, a third connection pad, a fourth connection pad, and a fifth connection pad having plate shapes and formed of conductive materials, respectively; and
four semiconductor resistance units connecting a predetermined pair of connection pads to each other among the first to fifth connection pads and having resistance values varying in proportion to a variation of a length due to the external pressure,
wherein the third connection pad is a common ground pad or a common power supply pad, and the first connection pad, the second connection pad, and the third connection pad constitute a first full Wheatstone bridge, and
the fourth connection pad, the fifth connection pad, and the third connection pad constitute a second full Wheatstone bridge.

17. The semiconductor pressure sensor of claim 16, wherein the third connection pad is disposed in a middle, the first connection pad and the second connection pad are disposed on one side of the third connection pad, and the fourth connection pad and the fifth connection pad are disposed on an opposite side of the third connection pad.

18. The semiconductor pressure sensor of claim 17, wherein the four semiconductor resistance units have an asymmetrical shape with respect to each other about the third connection pad.

19. The semiconductor pressure sensor of claim 16, wherein the first connection pad serves as an output of the first semiconductor resistance unit, and the second connection pad serves as an output of the second semiconductor resistance unit to constitute a first full Wheatstone bridge, and
the fourth connection pad serves as an output of the third semiconductor resistance unit, and the fifth connection pad serves as an output of the fourth semiconductor resistance unit to constitute a second full Wheatstone bridge.

20. The semiconductor pressure sensor of claim 16, wherein the third connection pad is a common ground pad, and
the four semiconductor resistance units are connected to an external applied voltage through external fixed resistors, respectively, to constitute two independent full Wheatstone bridges.

* * * * *